US012738948B2

(12) United States Patent
Kano

(10) Patent No.: US 12,738,948 B2

(45) Date of Patent: Sep. 15, 2026

(54) CIRCUIT APPARATUS AND CONTROL METHOD

(71) Applicant: NEC Corporation, Tokyo (JP)

(72) Inventor: Yuya Kano, Tokyo (JP)

(73) Assignee: NEC CORPORATION, Tokyo (JP)

( * ) Notice: Subject to any disclaimer, the term of this patent is extended or adjusted under 35 U.S.C. 154(b) by 21 days.

(21) Appl. No.: 18/969,380

(22) Filed: Dec. 5, 2024

(65) Prior Publication Data

US 2026/0163575 A1 Jun. 11, 2026

(30) Foreign Application Priority Data

Dec. 11, 2023 (JP) ................................ 2023-208573

(51) Int. Cl.

| | |
|---|---|
| ***G06N 10/40*** | (2022.01) |
| ***H03B 15/00*** | (2006.01) |
| ***H03B 28/00*** | (2006.01) |
| ***H03L 7/099*** | (2006.01) |
| ***H10N 69/00*** | (2026.01) |

(52) U.S. Cl.

CPC ............. *H03L 7/099* (2013.01); *G06N 10/40* (2022.01); *H03B 15/003* (2013.01); *H03B 28/00* (2013.01); *H10N 69/00* (2023.02)

(58) Field of Classification Search

CPC ........ G06N 10/00; G06N 10/40; H03B 15/00; H03B 15/003; H03B 28/00; H03L 7/099; H10N 60/12; H10N 60/805; H10N 69/00

See application file for complete search history.

(56) References Cited

U.S. PATENT DOCUMENTS

| | | | | |
|---|---|---|---|---|
| 10,097,186 | B1 * | 10/2018 | Epstein | H03K 19/1958 |
| 2005/0001209 | A1 * | 1/2005 | Hilton | G06N 10/40 257/20 |
| 2017/0104493 | A1 * | 4/2017 | Goto | H10N 60/12 |
| 2018/0017603 | A1 * | 1/2018 | Goto | G01R 23/02 |
| 2018/0017978 | A1 * | 1/2018 | Goto | H10N 60/805 |
| 2021/0116499 | A1 * | 4/2021 | Yamamoto | G06N 10/20 |
| 2022/0247407 | A1 | 8/2022 | Yamamoto et al. | |
| 2024/0311676 | A1 * | 9/2024 | Reagor | H10D 48/3835 |

FOREIGN PATENT DOCUMENTS

WO 2021/014885 A1 1/2021

OTHER PUBLICATIONS

Z.R.Lin et al., "Josephson parametric phase-locked oscillator and its application to dispersive readout of superconducting qubits", Nature Communications, vol. 5, Article No. 4480, 2014.

* cited by examiner

*Primary Examiner* — Levi Gannon

(74) *Attorney, Agent, or Firm* — Sughrue Mion, PLLC

(57) ABSTRACT

A circuit apparatus includes: a plurality of parametric oscillators; a magnetic field generator provided for each of the parametric oscillators; a coupler provided for each of the parametric oscillators; a signal generator configured to output a phase-locking signal incident on the parametric oscillator via the coupler and a pump signal incident on the magnetic field generator; and a controller configured to control the signal generator, wherein the parametric oscillator includes a variable element, the magnetic field generator applies a magnetic field to the variable element, the signal generator includes output channels for the phase-locking signal, a number of the output channels being fewer than a number of the parametric oscillators, and the controller controls a phase difference between the phase-locking signal and the pump signal.

17 Claims, 6 Drawing Sheets

OCCURRENCE PROBABILITY y

0 x $2\pi$ $\Delta\theta_i$

Figure 3:
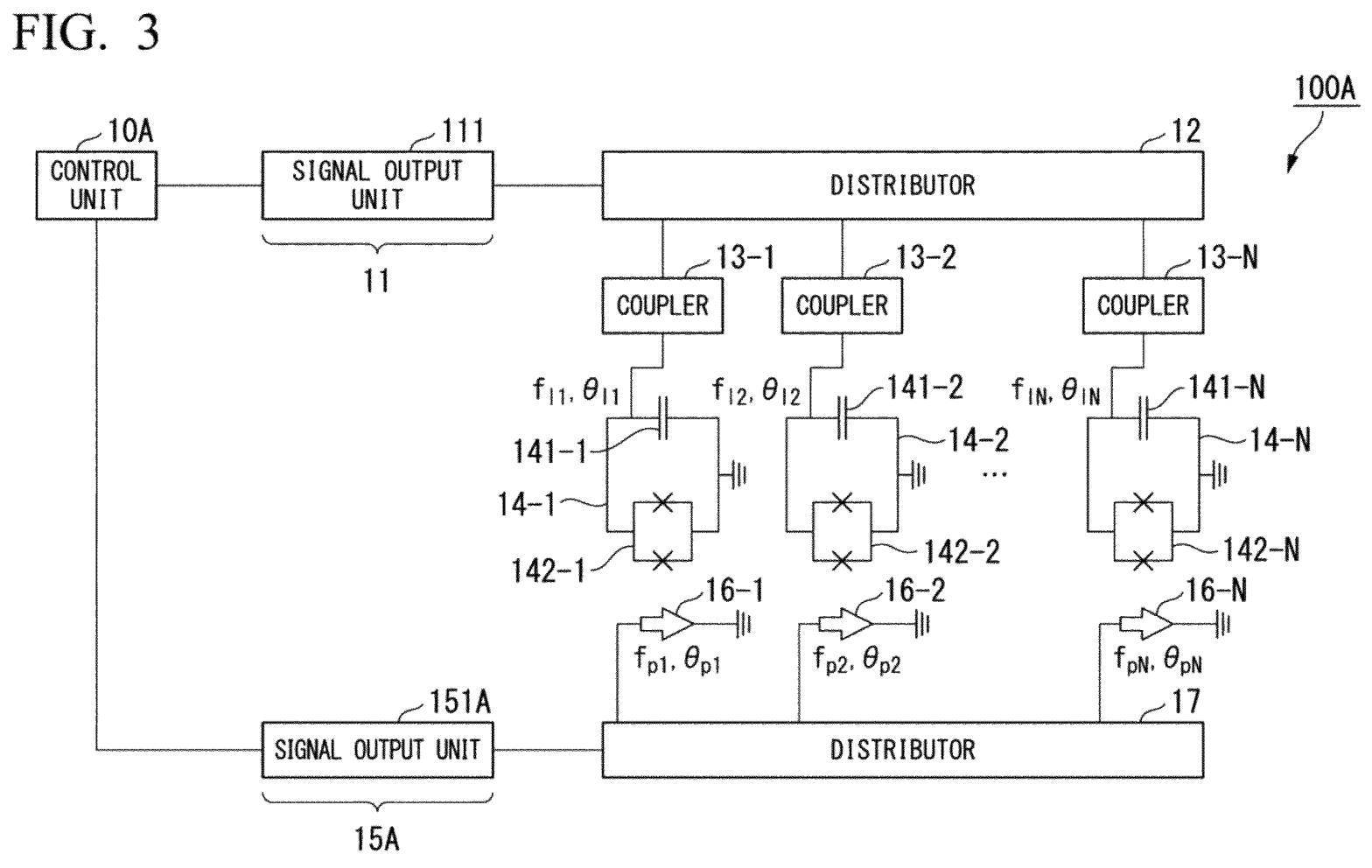

CONTROL UNIT 10A

SIGNAL OUTPUT UNIT 111

11

DISTRIBUTOR 12

COUPLER 13-1

COUPLER 13-2

COUPLER 13-N $f_{I1}, \theta_{I1}$ $f_{I2}, \theta_{I2}$ $f_{IN}, \theta_{IN}$ 141-1 14-1 142-1

141-2 14-2 142-2

141-N 14-N 142-N 16-1 $f_{p1}, \theta_{p1}$ 16-2 $f_{p2}, \theta_{p2}$

16-N $f_{pN}, \theta_{pN}$

DISTRIBUTOR 17

SIGNAL OUTPUT UNIT 151A

15A

100B
CONTROL UNIT
10B
SIGNAL OUTPUT UNIT
181
18
DISTRIBUTOR
19
COUPLER
13-1
COUPLER
13-2
COUPLER
13-N
$f_{I1}, \theta_{I1}$
$f_{I2}, \theta_{I2}$
$f_{IN}, \theta_{IN}$
141-1
14-1
142-1
141-2
14-2
142-2
141-N
14-N
142-N
16-1
16-2
16-N
$f_{p1}, \theta_{p1}$
$f_{p2}, \theta_{p2}$
$f_{pN}, \theta_{pN}$
...

FIG. 5

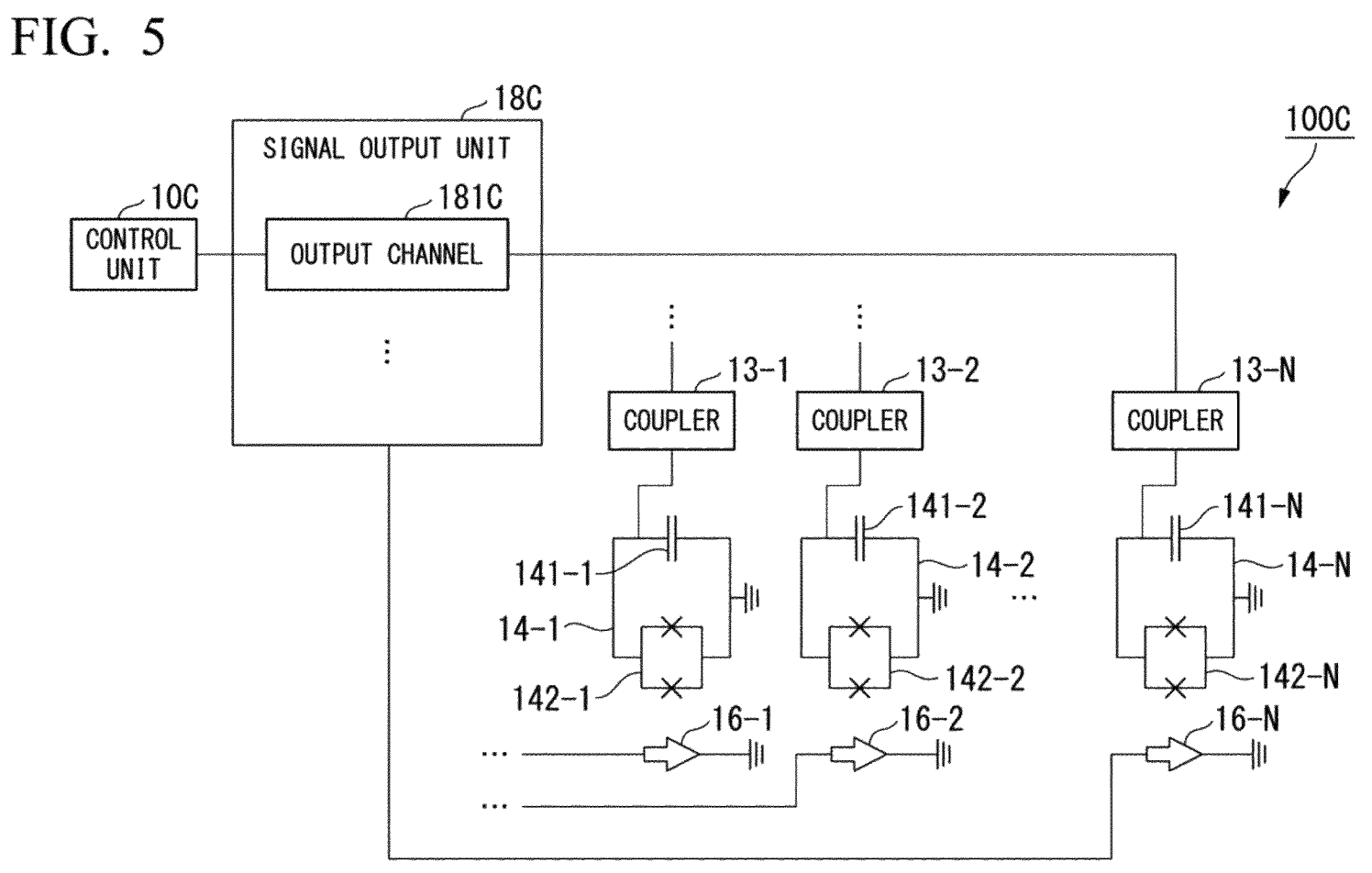

100C
10C CONTROL UNIT
18C SIGNAL OUTPUT UNIT
181C OUTPUT CHANNEL
13-1 COUPLER
13-2 COUPLER
13-N COUPLER
141-1
141-2
141-N
14-1
14-2
14-N
142-1
142-2
142-N
16-1
16-2
16-N

100′
CONTROL UNIT
10′
SIGNAL OUTPUT UNIT
111-1
111-2
111-N
11′
SIGNAL OUTPUT UNIT
151-1
151-2
151-N
15
COUPLER
13-1
13-2
13-N
141-1
141-2
141-N
14-1
14-2
14-N
142-1
142-2
142-N
16-1
16-2
16-N

CIRCUIT APPARATUS AND CONTROL METHOD

This application is based upon and claims the benefit of priority from Japanese patent application No. 2023-208573, filed on Dec. 11, 2023, the disclosure of which is incorporated herein in its entirety by reference.

TECHNICAL FIELD

The present disclosure relates to a circuit apparatus and a control method.

BACKGROUND ART

The Josephson parametric oscillator (JPO) is one of the superconducting quantum bits used in quantum computation. PCT International Publication No. WO2021/014885 discloses a quantum computer including a configuration in which a plurality of JPOs are coupled. In a case where two coherent states of the JPO are used as computation bits (0 and 1, respectively, hereinafter referred to as quantum bits), the JPO can be controlled by inputting two types of high-frequency signals. The first type is a pump signal. In a case where an AC magnetic field based on a pump signal is input to a superconducting-quantum-interference-device (SQUID) loop circuit included in the JPO, the JPO oscillates and operates as a quantum bit. The second type is a phase-locking signal. In a case where a high-frequency signal (a phase-locking signal) is input to the JPO via a coupler, an occurrence probability of a 0 state and a 1 state can be controlled (see Z. R. Lin et al., "Josephson parametric phase-locked oscillator and its application to dispersive readout of superconducting qubits", Nature Communications volume 5, Article number: 4480 (2014), [Retrieved 2023 Nov. 30], Internet, (https://doi.org/10.1038/ncomms5480); hereinafter Non-Patent Document 1).

Non-Patent Document 1 shows a technology for controlling the JPO by inputting the two types of high-frequency signals described above. According to the technology disclosed in Non-Patent Document 1, the number of JPOs constituting a computation device is the same as the number of output channels for outputting phase-locking signals.

SUMMARY

In a case where a scale of a quantum computer with a plurality of JPOs, such as in Patent Document 1, is enlarged, and a phase-locking signal is input to each JPO individually, the number of output channels will increase as the number of JPOs increases, and the device may become increased in size. In a case where a scale of a device with a plurality of oscillators other than a quantum computer with JPOs is enlarged, and a phase-locking signal is input to each oscillator individually, the number of output channels will increase as the number of oscillators increases, and the device may become increased in size.

Therefore, one of the objectives is to provide a technology that enables control of an oscillation state of an oscillator while reducing the number of output channels for phase-locking signals.

According to one example aspect of the present disclosure, a circuit apparatus includes a plurality of parametric oscillators, a magnetic field generator provided for each of the parametric oscillators, a coupler provided for each of the parametric oscillators, a signal generator configured to output a phase-locking signal incident on the parametric oscillator via the coupler and a pump signal incident on the magnetic field generator, and a controller configured to control the signal generator, wherein the parametric oscillator includes a variable element, the magnetic field generator is configured to apply a magnetic field to the variable element, the signal generator includes output channels for the phase-locking signal, a number of the output channels being fewer than a number of the parametric oscillators, and the controller is configured to control a phase difference between the phase-locking signal and the pump signal.

According to another example aspect of the present disclosure, a control method includes controlling a phase difference between a phase-locking signal and a pump signal in a circuit apparatus that includes a plurality of parametric oscillators, a magnetic field generator provided for each of the parametric oscillators, a coupler provided for each of the parametric oscillators, and a signal generator configured to output the phase-locking signal incident on the parametric oscillator via the coupler and the pump signal incident on the magnetic field generator, wherein the parametric oscillator includes a variable element, the magnetic field generator is configured to apply a magnetic field to the variable element, and the signal generator includes output channels for the phase-locking signal, a number of the output channels being fewer than a number of the parametric oscillators.

BRIEF DESCRIPTION OF THE DRAWINGS

FIG. 1 is a first diagram which shows an example of a superconducting quantum circuit device according to an example embodiment.

FIG. 2 is a diagram which describes an occurrence probability of a 0 state and a 1 state of a JPO.

FIG. 3 is a second diagram which shows an example of the superconducting quantum circuit device according to the example embodiment.

FIG. 5 is a fourth diagram which shows an example of the superconducting quantum circuit device according to the example embodiment.

EXAMPLE EMBODIMENT

Figure 4:
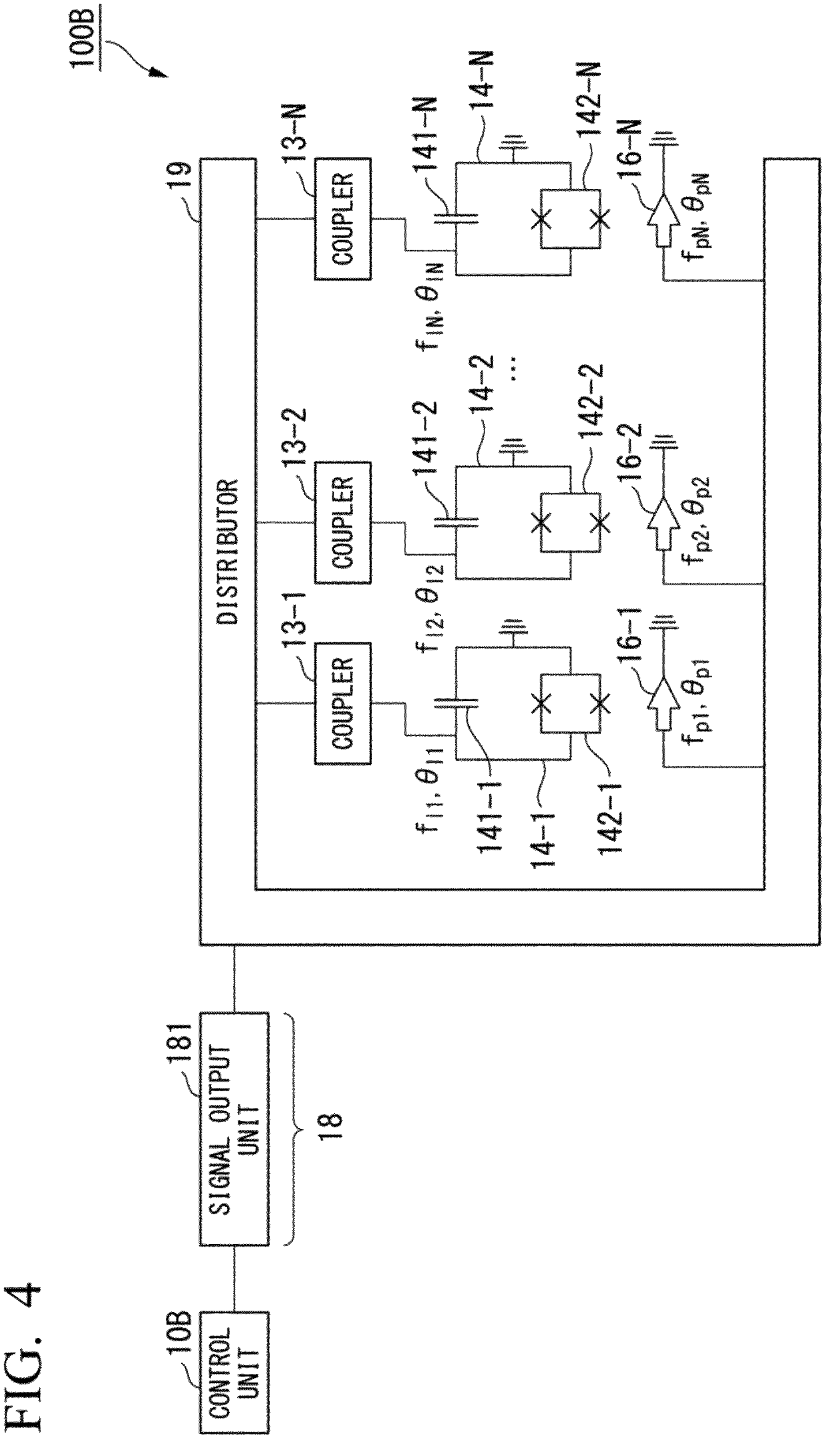
FIG. 4 is a third diagram which shows an example of the superconducting quantum circuit device according to the example embodiment.

In the present disclosure, a parametric oscillator refers to an oscillator having a variable element, and refers to an oscillator in which a circuit parameter of the variable element is periodically changed by an external action to cause a parametric excitation of the oscillator. The circuit parameter of the variable element is, for example, inductance of an inductor, and in this case, an inductor capable of changing the inductance is used. The external action is, for example, a magnetic field. In the following description, an example is shown in which a Josephson parametric oscillator is used as a parametric oscillator, an oscillation state of the oscillator (for example, a state of an oscillation phase) is controlled, which is the same even in a case where other oscillators are used, and in a case where used as a quantum bit, two states are represented depending on the state of the oscillation phase, which is the same in a case where other oscillators are used.

Hereinafter, a JPO control device and a superconducting quantum circuit device according to each example embodiment of the present disclosure will be described with reference to the drawings. Here, a superconducting quantum circuit device is one form of a circuit device in this application, and is a circuit device that utilizes superconductivity and a quantum phenomenon. In drawings used in the following description, a configuration of parts not related to the present disclosure may be omitted or may not be shown. The same or corresponding constituents in all drawings may be denoted by the same reference numerals, and common descriptions may be omitted.

First Example Embodiment (Configuration)

Figure 1:
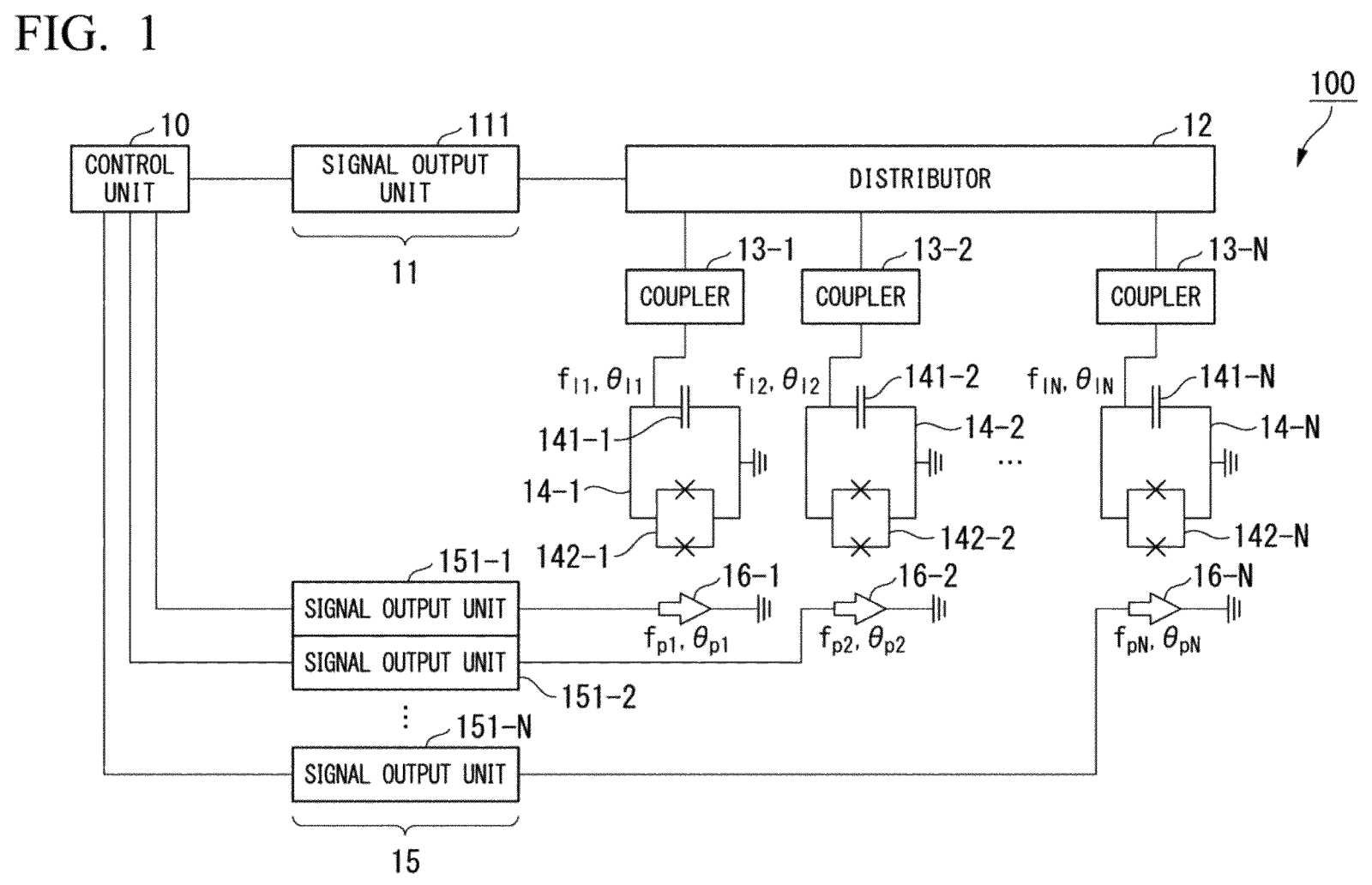

FIG. 1 is a first diagram which shows an example of a superconducting quantum circuit device according to an example embodiment. As shown in FIG. 1, the superconducting quantum circuit device 100 includes a control unit 10, a phase-locking signal output unit 11, a distributor 12, N couplers 13-1 to 13-N, N JPOs 14-1 to 14-N, a pump signal output unit 15, and N magnetic field generation units 16-1 to 16-N.

The phase-locking signal output unit 11 includes a signal output unit 111. The signal output unit 111 is one output channel. The phase-locking signal output unit 11 is configured from, for example, an arbitrary waveform generator, an IQ mixer, a digital to analog conversion circuit, and the like, but the present disclosure is not limited to these. The phase-locking signal output unit 11 outputs a phase-locking signal having a waveform according to the following equation (2) from the phase-locking signal output unit 111 based on an instruction from the control unit 10. Here, t is time, $V_{li}$ is a voltage amplitude, $f_{li}$ is a frequency, $\theta'_{li}$ is a phase, and $g_{li}(t)$ is an envelope curve of a pulse. For example, $f_{li}$ is the same frequency as a resonance frequency of the JPO 14-*i*. Examples of the envelope curve of a pulse $g_{pi}(t)$ include, but are not limited to, a Gaussian function, a rectangular function, and a trapezoidal function.

$$\left.\begin{aligned} P_l(t) &= \sum_i P_{li}(t) \\ P_{li}(t) &= V_{li}\sin(2\pi f_{li}t + \theta'_{li})\cdot g_{li}(t) \end{aligned}\right\} \quad (2)$$

The distributor 12 connects the signal output unit 111 with the couplers 13-1 to 13-N. The distributor 12 is configured from, for example, a transmission line, a splitter, a filter, and the like, but the present disclosure is not limited to these.

The coupler 13-*i* (i=1 to N) transmits a phase-locking signal from the distributor 12 to the JPO 14-*i*. The couplers 13-1 to 13-N are configured using, for example, capacitors, and transmit a phase-locking signal from the distributor 12 to the JPO 14-*i* (i=1 to N) by a resonator, capacitive coupling, inductive coupling, or the like, but the present disclosure is not limited to these.

The distributor 12 and the couplers 13-1 to 13-N are configured to transmit a signal proportional to $P_{li}(t)$ to an $i^{th}$ JPO. The signal proportional to $P_{li}(t)$ represents, for example, a signal in which the voltage of $P_{li}(t)$ is attenuated or amplified. For example, the distributor 12 may be configured using a transmission line, and may be furthermore configured to include a filter or the like that transmits only a signal of a frequency incident on a first JPO 14-1 at a connection with the coupler 13-1, and a filter or the like that transmits only a signal of a frequency incident on an $i^{th}$ JPO 14-*i* at a connection with the coupler 13-*i*. In another example of the configuration, in addition to $P_{li}(t)$, a different signal, for example, $P_{lj}(t)$ $$(j \neq i \text{ and } 1 \leqq j \leqq N)$$

may be transmitted to the $i^{th}$ JPO 14-*i*. For example, the distributor 12 may be configured using a transmission line, and configured not to include a filter or the like. Resonant frequencies of the JPO 14-1 to JPO 14-N are different from each other, and the phase-locking signal output unit 11 transmits a signal $P_l(t)$ on which the resonant frequencies of the JPO 14-1 to JPO 14-N are superimposed. In a case where no filter or the like is provided in the distributor 12, $P_{li}(t)$ is incident on the JPO 14-1 to JPO 14-N. In this case, in a case where a signal $P_{li}(t)$ corresponding to the resonant frequency of the JPO 14-*i* is included, even if a different signal $P_{lj}(t)$ is transmitted to JPO 14-*i*, it does not have much effect on an oscillation of the JPO 14-*i*. For this reason, the distributor 12 and the couplers 13-1 to 13-N can be configured so that $P_{lj}(t)$ $$(j \neq i \text{ and } 1 \leqq j \leqq N)$$

is transmitted to the $i^{th}$ JPO 14-I.

The JPO 14-1 to JPO 14-N are Josephson parametric oscillators. One quantum bit is expressed by one JPO 14-*i*. The JPO 14-1 includes a capacitor 141-1 and a loop circuit 142-1. The loop circuit 142-1 is a connection of two or more Josephson junctions in a ring shape, and can be called a SQUID. Here, the Josephson junction refers to, for example, an element having a structure in which a thin insulating film is sandwiched between a first superconductor and a second superconductor. As described below, the loop circuit 142 is a kind of variable element and acts as an equivalent inductor, so that the JPO 14-1 resonates at a frequency identified by an inductance of the equivalent inductor and a capacitance of a capacitor, and furthermore, the JPO 14-1 oscillates by a pump signal, which will be described below. The same will be applied to the other JPOs 14-2 to 14-N. The JPO 14-*i* is configured so that a phase-locking signal having a frequency similar to the resonant frequency of the JPO 14-*i* is incident on the JPO 14-*i*. The JPO 14-*i* is configured so that a pump signal having a frequency, for example, approximately twice the resonant frequency of the JPO 14-*i* is incident on the magnetic field generation unit 16-*i* corresponding to the JPO 14-*i*.

The pump signal output unit 15 includes signal output units 151-1 to 151-N. The signal output units 151-1 to 151-N are N output channels. The pump signal output unit 15 is configured from, for example, an arbitrary waveform generator, an IQ mixer, a digital to analog conversion circuit, and the like, but the present disclosure is not limited to these. The signal output unit 151-1 outputs a pump signal to the magnetic field generation unit 16-1, generates an AC magnetic field, and applies the AC magnetic field to the loop circuit 142-1. The same will be applied to the signal output units 151-2 to 151-N. The pump signal output unit 15 outputs a pump signal having a waveform according to the following equation (3) from an $i^{th}$ signal output unit 151-*i* based on an instruction of the control unit 10.

$$P_{pi}(t) = V_{pi}\sin(2\pi f_{pi}t + \theta'_{pi})g_{pi}(t) \quad (3)$$

Here, t indicates time. $V_{pi}$ indicates a voltage amplitude, $f_{pi}$ indicates a frequency, $\theta'_{pi}$ indicates a phase, and $g_{pi}(t)$ indicates an envelope curve of a pulse. For example, $f_{pi}$ is a frequency that is, for example, approximately twice the resonant frequency of the JPO 14-*i*. Examples of the envelope curve of a pulse $g_{pi}(t)$ include, but are not limited to, a Gaussian function, a rectangular function, and a trapezoidal function.

At this time, a path delay from the pump signal output unit 15 to the magnetic field generation units 16-1 to 16-N is taken into consideration. That is, in a case where a phase of a signal incident on the JPO 14-1 to JPO 14-N is defined as $\theta_{pi}$ and the path delay is defined as $\delta_{pi}$, $\theta'_{pi}$ in Equation (3) is calculated as shown in the following equation (4).

$$\theta'_{pi} = \theta_{pi} - \delta_{pi} \tag{4}$$

The magnetic field generation unit 16-1 and the loop circuit 142-1 are magnetically coupled via mutual inductance. The magnetic field generation unit 16-1 is a circuit that generates an AC magnetic field by a current flowing through the magnetic field generation unit 16-1 and applies the AC magnetic field to the loop circuit 142-1. An equivalent inductance of the loop circuit 142-1 changes depending on a magnitude of the magnetic field applied to the loop circuit 142-1. In other words, the loop circuit 142-1 is a variable element. As a result, the JPO 14-1 can be parametrically oscillated by the AC magnetic field. In addition to an AC current, a DC current may be superimposed on the magnetic field generation unit 16-1, and a resonance frequency or oscillation frequency of the JPO 14-1 can be controlled according to a magnitude of the DC current. The same will be applied to the magnetic field generation units 16-2 to 16-N.

The control unit 10 controls the phase-locking signal output unit 11 and the pump signal output unit 15 to make each of the phase-locking signal output unit 11 and the pump signal output unit 15 output high-frequency signals of a predetermined frequency and phase. As described above, in a case where a quantum bit is controlled, it is necessary to manipulate a phase difference between the two signals. In a case where a phase of a pump signal incident on a JPO is set to $\theta_p$ and a phase of a phase-locking signal is set to $\theta_l$ with a certain time set as a reference point, an occurrence probability of a 0 state and a 1 state of the quantum bit can be controlled by manipulating the phase difference $\Delta\theta$ defined in the following equation (1).

$$\Delta\theta = \theta_1 - (\theta_p / 2) \tag{1}$$

The control unit 10 controls the occurrence probability of the 0 state and the 1 state of the quantum bit of the JPO 14-*i* by manipulating the phase difference $\Delta\theta$ defined in Equation (1) described above by outputting a desired signal from each of the phase-locking signal output unit 11 and the pump signal output unit 15. Specifically, the control unit 10 calculates the phase $\theta'_{li}$ of Equation (2) described above according to the following equations (5) and (6).

$$\theta'_{li} = \theta_{li} - \delta_{li} \tag{5}$$

$$\theta_{li} = (\theta_{pi} / 2) + \Delta\theta_i \tag{6}$$

Here, $\theta_{li}$ indicates a phase of a signal incident on the $i^{th}$ JPO 14-*i*, $\delta_{li}$ indicates a path delay from the phase-locking signal output unit 11 to the $i^{th}$ JPO 14-*i*, and $\Delta\theta_i$ indicates a parameter that the control unit 10 can manipulate to any value.

In the superconducting quantum circuit device 100 shown in FIG. 1, a pump signal having a frequency $f_{pi}$ and a phase $\theta_{pi}$ is incident on the magnetic field generation unit 16-*i* corresponding to the $i^{th}$ JPO 14-*i*. In addition, a phase-locking signal having a frequency $f_{li}$ and a phase $\theta_{li}$ is incident on the $i^{th}$ JPO 14-*i*. For this reason, a phase difference $\Delta\theta$ between the two signals incident on the $i^{th}$ JPO 14-*i* is $\Delta\theta_i$ in the following equation, and this value can be arbitrarily manipulated by the control unit 10.

$$\Delta\theta_i = \theta_{li} - (\theta_{pi} / 2) \tag{1'}$$

As will be described next with reference to FIG. 2. $\Delta\theta_i$ corresponds to a quantum bit state (the occurrence probability of the 0 state and the 1 state) of the JPO 14-*i*. In other words, by manipulating $\Delta\theta_1$ to a desired value, it is possible to control the occurrence probability of the 0 state and the 1 state in the $i^{th}$ JPO 14-*i*. The control unit 10 controls the quantum bit state of the JPO 14-*i* by manipulating the phase difference $\Delta\theta_i$ between the phase-locking signal and the pump signal using Equations (5), (6), and (1').

Figure 2:
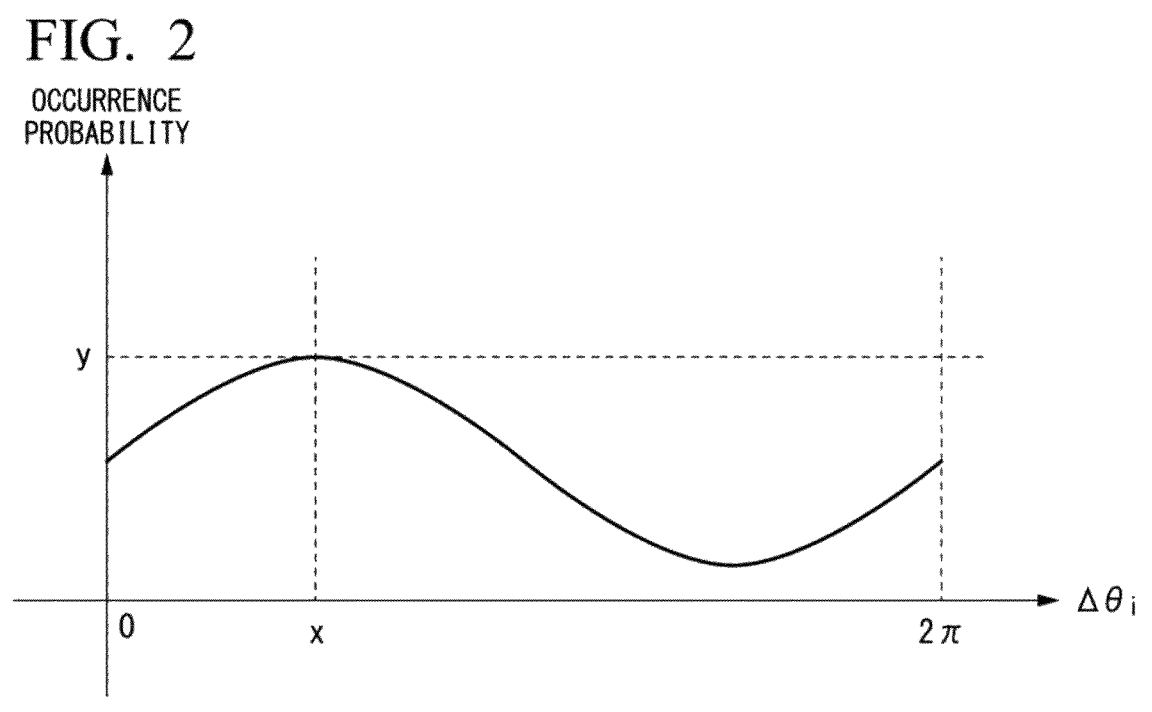

FIG. 2 shows an example of a relationship between $\Delta\theta_i$ and the occurrence probability of the 0 state and the 1 state. A vertical axis of FIG. 2 shows the occurrence probability of the 1 state, and a horizontal axis thereof shows the phase difference $\Delta\theta_i$ between the phase-locking signal and the pump signal. For example, in a case where the occurrence probability of 1 is set to y, the control unit 10 controls a phase of a phase-locking signal incident on the JPO 14-*i* and a phase of a pump signal incident on the magnetic field generation unit 16-*i* so that $\Delta\theta_i$ becomes x. As a result, the occurrence probability of the 1 state in the JPO 14-*i* can be controlled to be y, and the occurrence probability of the 0 state in the JPO 14-*i* can be controlled to be 1−y.

In a case where an AC magnetic field of, for example, approximately twice the resonant frequency of the JPO 14-*i* is applied to the magnetic field generation unit 16-*i* and a phase-locking signal of the same frequency as the resonant frequency is incident on the JPO 14-*i*, the JPO 14-*i* oscillates. In a quantum computer including the superconducting quantum circuit device 100 reads the occurrence probability of the 0 state and the 1 state based on the oscillation state of the JPO 14-*i* and performs calculations. For example, in a case where the control unit 10 performs control so that $\Delta\theta_i$=x, the quantum computer reads that the occurrence probability of the 0 state is 1−y and the occurrence probability of the 1 state is y.

Figure 6:
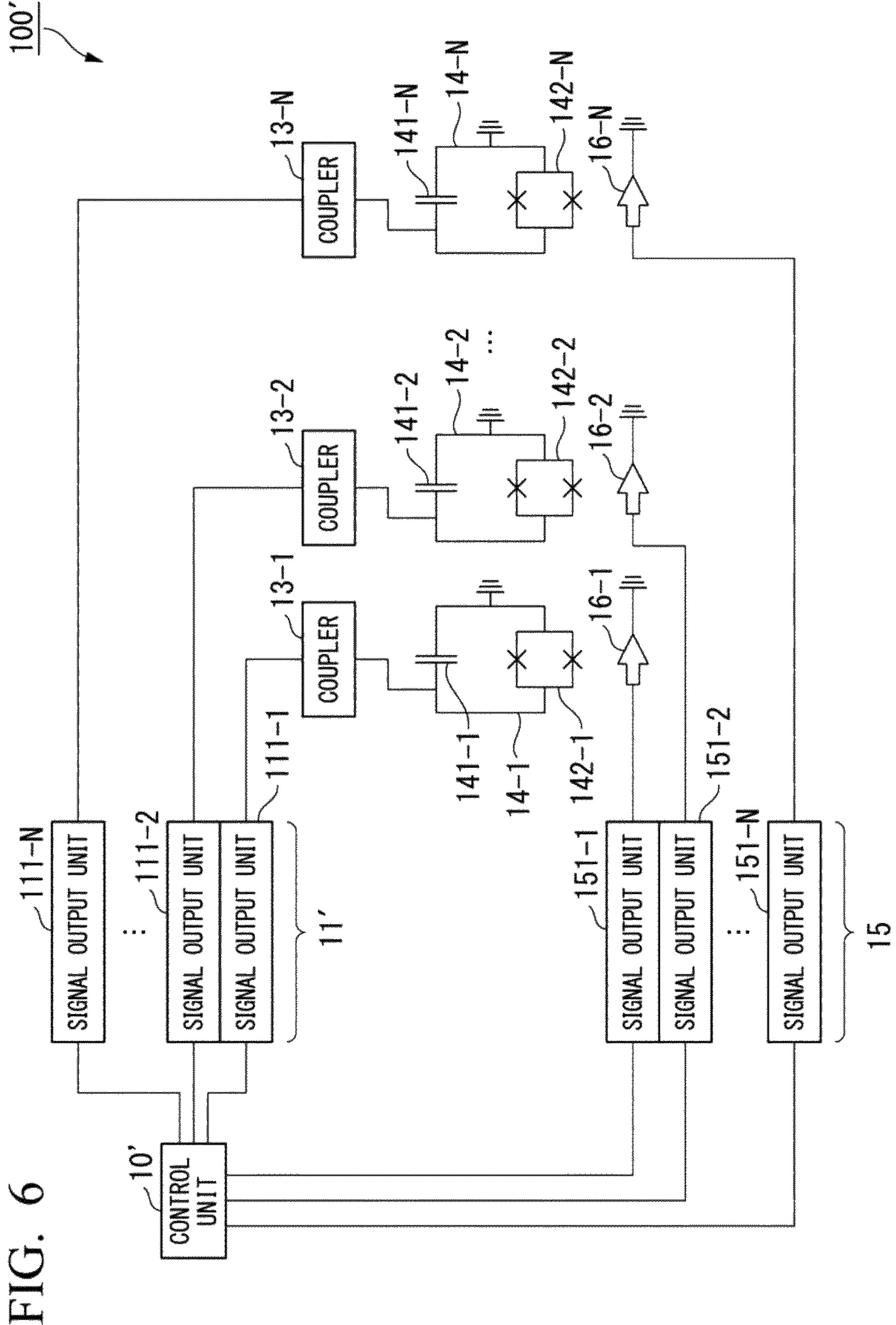
FIG. 6 is a diagram which shows an example of a general superconducting quantum circuit device.

For comparison, a configuration example of a typical superconducting quantum circuit device including N JPOs is shown in FIG. 6. In a superconducting quantum circuit device 100' shown in FIG. 6, a phase-locking signal output unit 11' includes N output channels, and signal output units 111-1 to 111-N. The signal output unit 111-1 is connected to the coupler 13-1, and is configured so that a phase-locking signal $P_{l1}(t)$ having a frequency and a phase for the first JPO 14-1 is incident on the JPO 14-1. The same will be applied to the signal output units 111-2 to 111-N.

In contrast, in the superconducting quantum circuit device 100 according to the present example embodiment shown in FIG. 1, the number of output channels for the phase-locking signal output unit 11 is reduced to one. In addition, a phase difference $\Delta\theta_i$ between the phase-locking signal incident on the JPO 14-*i* (i=1 to N) and the pump signal incident on the magnetic field generation unit 16-*i* can be manipulated.

Effect

As described above, the superconducting quantum circuit device 100 according to the first example embodiment can reduce the number of output channels of the phase-locking signal and control the occurrence probability of the 0 state and the 1 state of the JPO.

Note that in the example of FIG. 1, the number of output channels of the phase-locking signal output unit 11 is reduced from N to 1, but the example embodiment is not limited to this. For example, the number of output channels may be reduced to two, and the first output channel may be configured to output a phase-locking signal defined by Equation (2) to the JPOs 14-1 to 14-*n*

$$(1 \leqq n < N),$$

and to output a phase-locking signal similarly defined by Equation (2) to the remaining JPOs 14-*n*+1 to 14-N. Similarly, the number of output channels for the phase-locking signals may be reduced from N to three. By reducing the number of output channels for the phase-locking signals compared to the number of JPOs, it is possible to suppress an increase in size and cost of the device.

Second Example Embodiment (Configuration)

FIG. 3 is a second diagram which shows an example of a superconducting quantum circuit device according to an example embodiment. As shown in FIG. 3, a superconducting quantum circuit device 100A includes a control unit 10A, a phase-locking signal output unit 11, a distributor 12, N couplers 13-1 to 13-N, N JPOs 14-1 to 14-N, a pump signal output unit 15A, N magnetic field generation units 16-1 to 16-N, and a distributor 17.

In a case of comparison to the first example embodiment, this differs in that the number of pump signal output channels is reduced from N to one, and that the pump signal is incident from one output channel to the magnetic field generation units 16-1 to 16-N via the distributor 17.

The pump signal output unit 15A includes a signal output unit 151A which is one output channel. The pump signal output unit 15A is configured from, for example, an arbitrary waveform generator, an IQ mixer, a digital to analog conversion circuit, and the like, but the present disclosure is not limited to these. The pump signal output unit 15A outputs a pump signal having a waveform according to the following equation (7) from the signal output unit 151A based on the instruction of the control unit 10. $P_{pi}(t)$ on the right side of Equation (7) is as shown in Equation (3) described above.

$$P_p(t) = \sum_i P_{pi}(t) \tag{7}$$

The distributor 17 connects the signal output unit 151A to the magnetic field generation units 16-1 to 16-N. The distributor 17 is configured from, for example, a transmission line, a splitter, a filter, and the like, but the present disclosure is not limited to these.

The distributor 17 is configured so that a signal proportional to $P_{pi}(t)$ is transmitted to the $i^{th}$ magnetic field generation unit 16-*i*. The signal proportional to $P_{pi}(t)$ is, for example, a signal in which the voltage of $P_{pi}(t)$ is attenuated or amplified. For example, the distributor 17 may be configured using a transmission line, and may be furthermore configured to include a filter or the like that transmits only a signal of a frequency incident on the first magnetic field generation unit 16-1 at a connection with the magnetic field generation unit 16-1, and a filter or the like that transmits only a signal of a frequency incident on an $i^{th}$ magnetic field generation unit 16-*i* at a connection with the magnetic field generation unit 16-*i*. In another example of the configuration, in addition to $P_{pi}(t)$, a different signal, for example $P_{pj}(t)$ $$(j \neq i \text{ and } 1 \leqq j \leqq N)$$

may be transmitted to the $i^{th}$ magnetic field generation unit 16-*i*. The reason is the same as in a case of the phase-locking signal.

The control unit 10A instructs the phase-locking signal output unit 11 to output a phase-locking signal having a waveform according to Equation (2), and instructs the pump signal output unit 15A to output a pump signal having a waveform according to Equation (7). In this case too, the control unit 10A controls the quantum bit state of the JPO 14-*i* (i=1 to N) by manipulating the phase difference $\Delta\theta_i$ based on Equations (5), (6), and (1') described above.

Effect

As described above, the superconducting quantum circuit device 100A according to the second example embodiment can reduce the number of output channels for the pump signal in addition to effects obtained by the superconducting quantum circuit device 100 exemplified in FIG. 1.

Note that in the example of FIG. 3, the number of output channels of the pump signal output unit 15A is reduced from N to one, but the example embodiment is not limited to this. For example, the number of output channels of the pump signal output unit 15A may be reduced from N to two, and the first output channel may be configured to output a pump signal defined by Equation (7) to the magnetic field generation units 16-1 to 16-*n*

$$(1 \leqq n < N),$$

and to output a pump signal similarly defined by Equation (7) to remaining magnetic field generation units 16-*n*+1 to 16-N. Similarly, the number of output channels for the pump signal may be reduced from N to three. By making the number of output channels for the phase-locking signal and the pump signal smaller than the number of JPOs, it is possible to suppress an increase in size and cost of the device.

Third Example Embodiment (Configuration)

FIG. 4 is a third diagram which shows an example of a superconducting quantum circuit device according to an example embodiment. As shown in FIG. 4, a superconducting quantum circuit device 100B includes a control unit 10B, an output unit 18 for the phase-locking signal and the pump signal, a distributor 19, N couplers 13-1 to 13-N, N JPOs 14-1 to 14-N, and N magnetic field generation units 16-1 to 16-N.

In a case of comparison to the first and second example embodiments, this example embodiment differs in that the pump signal and the phase-locking signal are output from a single common output channel, the phase-locking signal is incident to N JPOs via the single common distributor 19 and the couplers 13-1 to 13-N, and the pump signal is incident to N magnetic field generation units 16-1 to 16-N via the distributor 19.

The output unit 18 for the phase-locking signal and the pump signal has a signal output unit 181, which is an output channel. The output unit 18 for the phase-locking signal and the pump signal is configured from, for example, an arbitrary waveform generator, an IQ mixer, a digital to analog conversion circuit, and the like, but the present disclosure is not limited to these. The output unit 18 for the phase-locking signal and the pump signal outputs a pump signal having a waveform according to the following equation (8) from the signal output unit 181 based on an instruction from the control unit 10B. $P_{li}(t)$ on the right side of Equation (8) is as shown in Equation (2) described above, and $P_{Pi}(t)$ is as shown in Equation (3) described above.

$$P(t) = \left[\sum_i P_{li}(t)\right] + \left[\sum_i P_{pi}(t)\right] \tag{8}$$

The distributor 19 connects the signal output unit 181 to the magnetic field generation units 16-1 to 16-N, and connects the signal output unit 181 to the couplers 13-1 to 13-N. The distributor 19 is configured from, for example, a transmission line, a splitter, a filter, and the like, but the present disclosure is not limited to these.

The distributor 19 and the coupler 13-*i* are configured to transmit a signal proportional to $P_{li}(t)$ to the $i^{th}$ JPO 14-*i*. Alternatively, in addition to $P_{li}(t)$, the distributor 19 and the coupler 13-*i* may be configured to transmit a different signal, $P_{lj}(t)$ $$(j \neq i \text{ and } 1 \leqq j \leqq N)$$

and/or $P_{pk}(t)$ $$(1 \leqq k \leqq N),$$

to the JPO 14-*i*. In addition to that, the distributor 19 is configured to transmit a signal proportional to $P_{pi}(t)$ to the $i^{th}$ magnetic field generation unit 16-*i*. Alternatively, in addition to $P_{pi}(t)$, the distributor 19 may be configured to transmit a different signal, $P_{pj}(t)$ $$(j \neq i \text{ and } 1 \leqq j \leqq N)$$

and/or $P_{lk}(t)$ $$(1 \leqq k \leqq N)$$

to the magnetic field generation unit 16-*i*. For example, the distributor 19 may be configured using a transmission line, and a filter or the like that transmits only signals of the frequency that is incident on the JPO 14-*i* may be further provided at the connection with the coupler 13-*i*. Moreover, a filter or the like that transmits only signals of the frequency that is incident on the magnetic field generation unit 16-*i* may be provided at the connection of the distributor 19 with the magnetic field generation unit 16-*i*.

The control unit 10B instructs the output unit 18 of a phase-locking signal and a pump signal to output a signal having a waveform according to Equation (8). In this case too, the control unit 10A controls the quantum bit state of the JPO 14-*i* (i=1 to N) by manipulating the phase difference $\Delta\theta_i$ based on Equations (5), (6), and (1') described above.

Effect

As described above, the superconducting quantum circuit device 100B according to the third example embodiment can reduce the number of signal output channels in addition to effects obtained by the superconducting quantum circuit device 100 exemplified in FIG. 1 and the superconducting quantum circuit device 100A exemplified in FIG. 3.

Note that in the example of FIG. 4, the number of output channels of the output unit 18 for the phase-locking signal and the pump signal is one, but the number may be, for example, two or three. By reducing the number of output channels to be less than the number of JPOs, it is possible to suppress an increase in size and cost of the device.

Fourth Example Embodiment

FIG. 5 is a fourth diagram which shows an example of a superconducting quantum circuit device according to an example embodiment.

The superconducting quantum circuit device 100C includes a plurality of Josephson parametric oscillators (JPO) 14-1 to 14-N, magnetic field generation units 16-1 to 16-N provided for each of the Josephson parametric oscillators 14-1 to 14-N, couplers 13-1 to 13-N provided for each of the Josephson parametric oscillators 14-1 to 14-N, a signal output unit 18C that outputs phase-locking signals incident on the Josephson parametric oscillators 14-1 to 14-N via corresponding couplers 13-1 to 13-N and pump signals incident on the magnetic field generation units 16-1 to 16-N, and a control unit 10C that controls the signal output unit 18C. Each of the Josephson parametric oscillators 14-1 to 14-N includes a loop circuit 142-1 to 142-N, the magnetic field generation units 16-1 to 16-N apply magnetic fields to the loop circuits 142-1 to 142-N, respectively, and the signal output unit 18C includes output channels 181C for the phase-locking signal, which is fewer than the number of the Josephson parametric oscillators 14-1 to 14-N. A control unit 10C controls the phase difference between the phase-locking signal and the pump signal. As a result, for example, states of quantum bits of the Josephson parametric oscillators 14-1 to 14-N are controlled.

The example embodiment of the present disclosure has been described in detail above with reference to the drawings, but a specific configuration is not limited to the description above, and various design changes and the like can be made within a scope not departing from the gist of each of the present disclosure. In addition, various modifications of one aspect of the present disclosure can be made within the scope of the claims, and example embodiments obtained by appropriately combining technical means disclosed in different example embodiments are also included in a technical scope of the present disclosure. In addition, configurations in which elements described in each of the example embodiments and modifications described above are replaced elements having the same effect are included in a technical scope of the present disclosure. Then, each example embodiment can be combined with other example embodiments as appropriate. In addition, as exemplified in Patent Document 1, a circuit or wiring for coupling Josephson parametric oscillators with each other for quantum calculation may be provided separately. Moreover, in the description above, the state of a quantum bit has been described as the state of "0" and "1," but the state of a quantum bit can also be considered as a state of "+1" and "−1," and even in that case, an effect of this example embodiment will be the same. Also, in the description above, an example has been described in which the oscillation state of an oscillator is used as the state of a quantum bit, but the oscillator and its oscillation state may be used for other purposes. Examples of other purposes include reading the state of a quantum bit, amplifying a signal, allowing quantum bits to interact with each other, and the like.

According to the present disclosure, it is possible to enable control of the oscillation state of an oscillator while reducing the number of output channels for phase-locking signals.

A part or all of the example embodiments described above may be described as in the following supplementary note, but is not limited to the following.

(Supplementary Note 1)

A circuit apparatus is provided which includes a plurality of parametric oscillators, a magnetic field generator provided for each of the parametric oscillators, a coupler provided for each of the parametric oscillators, a signal generator configured to output a phase-locking signal incident on the parametric oscillator via the coupler and a pump signal incident on the magnetic field generator and a controller configured to control the signal generator, wherein the parametric oscillator includes a variable element, the magnetic field generator is configured to apply a magnetic field to the variable element, the signal generator includes output channels for the phase-locking signal, a number of the output channels being fewer than a number of the parametric oscillators, and the controller is configured to control a phase difference between the phase-locking signal and the pump signal.

(Supplementary Note 2)

The circuit apparatus described in Supplementary Note 1 is provided in which the signal generator is configured to output the phase-locking signal on which signals of different frequencies determined for each parametric oscillator are superimposed, and the signal generator includes one of the output channels for outputting the superimposed phase-locking signal.

(Supplementary Note 3)

The circuit device described in Supplementary Note 1 or 2 is provided in which one of the output channels for the phase-locking signal and each of the couplers are connected by a transmission line.

(Supplementary Note 4)

The circuit device described in Supplementary Note 1 or 2 is provided in which one of the output channels for the phase-locking signal and each of the couplers are connected by a transmission line, and a filter is provided at a connection between the transmission line and the coupler, the filter transmitting the phase-locking signal of a predetermined frequency corresponding to a frequency determined for the parametric oscillator corresponding to the coupler.

(Supplementary Note 5)

The circuit device described in any one of Supplementary Notes 1 to 4 is provided in which the signal generator includes output channels for the pump signal, a number of the output channels being fewer than a number of the parametric oscillators.

(Supplementary Note 6)

The circuit apparatus described in any one of Supplementary Notes 1 to 5 is provided in which the signal generator is configured to output the pump signal on which signals of different frequencies determined for each parametric oscillator are superimposed, and includes one of the output channels for the pump signal for outputting the superimposed pump signal.

(Supplementary Note 7)

The circuit apparatus described in Supplementary Note 6 is provided in which one of the output channels for the pump signal and each of the magnetic field generators are connected by a transmission line.

(Supplementary Note 8)

The circuit apparatus described in Supplementary Note 6 is provided in which one of the output channels for the pump signal and each of the magnetic field generators are connected by a transmission line, and a filter is provided at a connection between the transmission line and the magnetic field generator, the filter transmitting the pump signal of a predetermined frequency corresponding to a frequency determined for the parametric oscillator corresponding to the magnetic field generator.

(Supplementary Note 9)

The circuit apparatus described in Supplementary Note 1 is provided in which the signal generator is configured to output the phase-locking signals of different frequencies determined for each parametric oscillator and a signal on which the phase-locking signals are superimposed, and the signal generator includes one of the output channels for outputting the superimposed signal.

(Supplementary Note 10)

The circuit apparatus described in Supplementary Note 9 is provided in which one of the output channels and each of the couplers are connected by a transmission line.

(Supplementary Note 11)

The circuit apparatus described in Supplementary Note 9 is provided in which one of the output channels and each of the couplers are connected by a transmission line, and a filter is provided at a connection between the transmission line and the coupler, the filter transmitting the signal of the frequency determined for the parametric oscillator corresponding to the coupler.

(Supplementary Note 12)

The circuit apparatus described in any one of Supplementary Notes 9 to 11 is provided in which the output channel and each of the magnetic field generators are connected by a transmission line.

(Supplementary Note 13)

The circuit apparatus described in any one of Supplementary Notes 9 to 11 is provided in which the output channel and each of the magnetic field generators are connected by a transmission line, and a filter is provided at a connection between the transmission line and the magnetic field generator, the filter transmitting the signal of the frequency determined for the parametric oscillator corresponding to the magnetic field generator.

(Supplementary Note 14)

The circuit apparatus described in any one of Supplementary Notes 1 to is provided in which the parametric oscillator is a quantum bit, and a state of the quantum bit is controlled by the phase difference.

(Supplementary Note 15)

A control method is provided which includes controlling a phase difference between a phase-locking signal and a pump signal in a circuit apparatus that includes a plurality of parametric oscillators, a magnetic field generator provided for each of the parametric oscillators, a coupler provided for each of the parametric oscillators, and a signal generator configured to output the phase-locking signal incident on the parametric oscillator via the coupler and the pump signal incident on the magnetic field generator, wherein the parametric oscillator includes a variable element, the magnetic field generator is configured to apply a magnetic field to the variable element, and the signal generator includes output channels for the phase-locking signal, a number of the output channels being fewer than a number of the parametric oscillators.

(Supplementary Note 16)

The control method described in Supplementary Note 15 is provided in which the parametric oscillator is a quantum bit, and a state of the quantum bit is controlled by the phase difference.

(Supplementary Note 17)

The control method described in Supplementary Note 15 or 16 is provided in which the phase difference is controlled in the circuit apparatus based on data associating the phase difference with an occurrence probability of a 0 state and a 1 state of a quantum bit of the parametric oscillator, and a desired occurrence probability.

The aspects of Supplementary Notes 2 to 13 can be applied to the circuit apparatus in the control methods of Supplementary Notes 15 to 17.

The superconducting quantum circuit devices 100, 100A, 100B, and 100C of the example embodiment are examples of the circuit device. The JPOs 14-1 to 14-N are examples of the parametric oscillator. Loop circuits 142-1 to 142-N are examples of the variable element.

While preferred example embodiments of the disclosure have been described and illustrated above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

What is claimed is:

1. A circuit apparatus comprising:

a plurality of parametric oscillators;

a magnetic field generator provided for each of the parametric oscillators;

a coupler provided for each of the parametric oscillators;

a signal generator configured to output a phase-locking signal incident on the parametric oscillator via the coupler and a pump signal incident on the magnetic field generator; and a controller configured to control the signal generator, wherein the parametric oscillator includes a variable element, the magnetic field generator is configured to apply a magnetic field to the variable element, the signal generator includes output channels for the phase-locking signal, a number of the output channels being fewer than a number of the parametric oscillators, and the controller is configured to control a phase difference between the phase-locking signal and the pump signal.

2. The circuit apparatus according to claim 1, wherein the signal generator is configured to output the phase-locking signal on which signals of different frequencies determined for each parametric oscillator are superimposed, and the signal generator includes one of the output channels for outputting the superimposed phase-locking signal.

3. The circuit apparatus according to claim 1, wherein one of the output channels for the phase-locking signal and each of the couplers are connected by a transmission line.

4. The circuit apparatus according to claim 1, wherein one of the output channels for the phase-locking signal and each of the couplers are connected by a transmission line, and a filter is provided at a connection between the transmission line and the coupler, the filter transmitting the phase-locking signal of a predetermined frequency corresponding to a frequency determined for the parametric oscillator corresponding to the coupler.

5. The circuit apparatus according to claim 1, wherein the signal generator includes output channels for the pump signal, a number of the output channels being fewer than a number of the parametric oscillators.

6. The circuit apparatus according to claim 1, wherein the signal generator is configured to output the pump signal on which signals of different frequencies determined for each parametric oscillator are superimposed, and includes one of the output channels for the pump signal for outputting the superimposed pump signal.

7. The circuit apparatus according to claim 6, wherein one of the output channels for the pump signal and each of the magnetic field generators are connected by a transmission line.

8. The circuit apparatus according to claim 6, wherein one of the output channels for the pump signal and each of the magnetic field generators are connected by a transmission line, and a filter is provided at a connection between the transmission line and the magnetic field generator, the filter transmitting the pump signal of a predetermined frequency corresponding to a frequency determined for the parametric oscillator corresponding to the magnetic field generator.

9. The circuit apparatus according to claim 1, wherein the signal generator is configured to output the phase-locking signals of different frequencies determined for each parametric oscillator and a signal on which the phase-locking signals are superimposed, and the signal generator includes one of the output channels for outputting the superimposed signal.

10. The circuit apparatus according to claim 9, wherein one of the output channels and each of the couplers are connected by a transmission line.

11. The circuit apparatus according to claim 9, wherein one of the output channels and each of the couplers are connected by a transmission line, and a filter is provided at a connection between the transmission line and the coupler, the filter transmitting the signal of the frequency determined for the parametric oscillator corresponding to the coupler.

12. The circuit apparatus according to claim 9, wherein the output channel and each of the magnetic field generators are connected by a transmission line.

13. The circuit apparatus according to claim 9, wherein the output channel and each of the magnetic field generators are connected by a transmission line, and a filter is provided at a connection between the transmission line and the magnetic field generator, the filter transmitting the signal of the frequency determined for the parametric oscillator corresponding to the magnetic field generator.

14. The circuit apparatus according to claim 1, wherein the parametric oscillator is a quantum bit, and a state of the quantum bit is controlled by the phase difference.

15. A control method comprising:

controlling a phase difference between a phase-locking signal and a pump signal in a circuit apparatus that includes a plurality of parametric oscillators, a magnetic field generator provided for each of the parametric oscillators, a coupler provided for each of the parametric oscillators, and a signal generator configured to output the phase-locking signal incident on the parametric oscillator via the coupler and the pump signal incident on the magnetic field generator, wherein the parametric oscillator includes a variable element, the magnetic field generator is configured to apply a magnetic field to the variable element, and the signal generator includes output channels for the phase-locking signal, a number of the output channels being fewer than a number of the parametric oscillators.

16. The control method according to claim 15, wherein the parametric oscillator is a quantum bit, and a state of the quantum bit is controlled by the phase difference.

17. The control method according to claim 15, wherein the phase difference is controlled in the circuit apparatus based on data associating the phase difference with an occurrence probability of a 0 state and a 1 state of a quantum bit of the parametric oscillator, and a desired occurrence probability.

* * * * *